(12) United States Patent
Fitz et al.

(10) Patent No.: US 7,838,867 B1
(45) Date of Patent: Nov. 23, 2010

(54) METHOD OF FABRICATING TURNING MIRROR USING SACRIFICIAL SPACER LAYER AND DEVICE MADE THEREFROM

(75) Inventors: John L. Fitz, Windsor Mill, MD (US);
Daniel S. Hinkel, Sykesville, MD (US);
Scott C. Horst, Sykesville, MD (US)

(73) Assignee: United States of America as represented by the Director, National Security Agency, The, Washington, DC (US)

( * ) Notice: Subject to any disclaimer, the term of this patent is extended or adjusted under 35 U.S.C. 154(b) by 85 days.

(21) Appl. No.: 12/454,491

(22) Filed: May 13, 2009

Related U.S. Application Data

(62) Division of application No. 11/472,225, filed on Jun. 16, 2006, now Pat. No. 7,611,914.

(51) Int. Cl.
*H01L 29/06* (2006.01)
(52) U.S. Cl. .................... 257/13; 257/76; 257/79; 257/81; 257/87; 257/91; 257/95; 257/98; 438/22; 372/43.01
(58) Field of Classification Search .......... 257/13, 257/76, 79, 81, 87, 91, 95, 98; 438/22, FOR. 153; 372/43.01
See application file for complete search history.

(56) References Cited

U.S. PATENT DOCUMENTS 6,486,025 B1  11/2002  Liu et al.
7,092,421 B2 *  8/2006  Capasso et al. .......... 372/45.01
2007/0152225 A1 *  7/2007  Ooi et al. .................. 257/76
2007/0177647 A1 *  8/2007  Noda et al. ............... 372/50.1

OTHER PUBLICATIONS

U.S. Appl. No. 09/412,682, filed Nov. 1, 2001, Smith et al.
Hsu, W. et al; "A Sub-Micron Capacitive Gap Process for Multiple-Metal-Electrode Lateral Micromech. Resonators";Tech.Digest, 14th Int'l IEEE Micro Electro Mech. Conf.;Jan. 2001.
Rennon, S. et al.; "12 μm long edge-emitting quantum-dot laser"; Electronics Letters, May 2001.
Akiyama, S. et al.; "Air Trench Bends and Splitters for Dense Optical Integration in Low Index Contrast"; Journal of Lightwave Technology, Jul. 2005.

* cited by examiner

*Primary Examiner*—Thanh V Pham
(74) *Attorney, Agent, or Firm*—Robert D. Morelli

(57) ABSTRACT

The present invention is a method of fabricating a waveguide using a sacrificial spacer layer. The first step in this process is to fabricate the underlying optical semiconductor structure. A trench is then etched in this structure resulting in an underlying L-shaped structure. A sacrificial spacer layer is deposited in the trench. The waveguide is created in the trench on the sacrificial spacer layer using a mask layer to angle the vertex of the L-shaped structure. User-defined portions of the sacrificial spacer layer are subsequently removed to create air gaps between the waveguide and the sidewalls of the trench in the optical semiconductor.

4 Claims, 4 Drawing Sheets

METHOD OF FABRICATING TURNING MIRROR USING SACRIFICIAL SPACER LAYER AND DEVICE MADE THEREFROM

CROSS-REFERENCE TO RELATED APPLICATION

The present invention is a division of U.S. patent application Ser. No. 11/472,225, entitled "METHOD OF FABRICATING TURNING MIRROR USING SACRIFICIAL SPACER LAYER AND DEVICE MADE THEREFROM," filed Jun. 16, 2006 now U.S. Pat. No. 7,611,914.

FIELD OF THE INVENTION

The present invention relates to a semiconductor manufacturing process and, more specifically to a semiconductor manufacturing process for making a device including integrally formed optical waveguides.

BACKGROUND OF THE PRESENT INVENTION

Integration of semiconductor lasers to planar optical components, such as waveguides, semiconductor optical amplifiers (SOAs) and detectors, is important for photonic integrated circuit (PIC) applications. When working with PICs it is essential to control reflections from the interfaces between integrated photonic components. With proper design, interface reflections may be used to enhance performance of integrated lasers.

One method is to precisely space gaps between components to coherently enhance or reduce reflections from the interfaces. Prior art methods describe the use of resonant and anti-resonant etched gaps used to couple between lasers, SOAs and other lasers, taking advantage of the index discontinuity across air gaps to selectively enhance or reduce reflections across interfaces. A similar process has been demonstrated to create semiconductor lasers that make use of etched gaps in the semiconductor material to enhance reflectivity of the laser mirrors. At near-infrared wavelengths, electron beam lithography is frequently required to provide the necessary resolution to define the etch masks used to create the resonant gaps.

"A Sub-Micron Capacitive Gap Process for Multiple-Metal-Electrode Lateral Micromechanical Resonators," Wan That Hsu, et al, *Technical Digest*, 14$^{th}$ International IEEE Micro Electro Mechanical Conference, January 2001, discloses a process for fabricating a semiconductor having gaps between metal electrodes and a polysilicon resonator resident on the semiconductor. With this method, a sacrificial spacer layer is deposited on a substrate. A polysilicon mechanical resonator is then deposited and etched over the sacrificial layer, during which time portions of the sacrificial layer are removed, and the metal electrodes are formed through electroplating on either side of the resonator. The sacrificial layer is ultimately removed in its entirety. The present invention does not operate in the same manner as this process. The Hsu article is hereby incorporated by reference into the present invention.

"12 μm long edge-emitting quantum-dot laser," S. Rennon, et al, *Electronics Letters*, May 2001, discloses a series of mirrors and a central waveguide. Each of the mirrors and the central waveguide are etched. First order Bragg mirrors are patterned by electron-beam lithography on the rear side of the waveguide with air gaps etched between the Bragg gratings. Third order mirrors are etched on the front side of the waveguide. The first order air gaps between Bragg mirrors decrease diffraction loss in the laser (compared to third order air gaps) produced by this method. The present invention is not fabricated in the same manner as the invention of Rennon, et al. Rennon, et al is hereby incorporated by reference into the specification of the present invention.

"Air Trench Bends and Splitters for Dense Optical Integration in Low Index Contrast," Shoji Akiyama, et al, *Journal of Lightwave Technology*, July 2005, discloses air trench waveguides, and specifically air trench bend structures. It specifically describes a process for creating a waveguide with air trenches by first patterning the waveguide through a dry etching process and thereafter patterning the air trenches through a photolithography and dry etching process. The process of the present invention does not operate in this manner. Akiyama, et al is hereby incorporated by reference into the specification of the present invention.

U.S. patent application Ser. No. 09/412,682, entitled "SACRIFICAL SPACER FOR INTEGRATED CIRCUIT TRANSISTORS," discloses a semiconductor integrated circuit with a sacrificial sidewall. Specifically, temporary sidewalls are formed along the side of a gate electrode of a semiconductor. Source/drain regions are then formed on the semiconductor alongside the gate electrode, and the temporary sidewalls are removed, resulting in a space between the gate electrode and the source/drain regions. The present invention does not operate in this manner. U.S. patent application Ser. No. 09/412,682 is hereby incorporated by reference into the specification of the present invention.

U.S. Pat. No. 6,486,025, entitled "METHODS FOR FORMING MEMORY CELL STRUCTURES," discloses two methods for forming memory cell structures in a semiconductor integrated circuit. One method includes the use of a sacrificial spacer layer formed adjacent to the sidewall of a capacitor of a field effect transistor formed on the semiconductor device. A dielectric layer is then formed alongside the spacer layer, through which a bitline stud layer is formed that is electrically connected to the source/drain regions of the field effect transistor. The sacrificial spacer layer is finally removed from the structure. The present invention operates in a different manner from this process. U.S. Pat. No. 6,486,025 is hereby incorporated by reference into the specification of the present invention.

The methods described above effectively create air gaps in semiconductor structures, however the processes are extremely inefficient as applied to optical devices. Typically several masking and etching steps are required to create both the components, such as waveguides, and the air gaps in optical devices. This can be both time-consuming and costly. What is desirable in the art is to create an efficient, inexpensive method of creating optical semiconductor devices with integrated air gaps.

SUMMARY OF THE INVENTION

It is an object of the present invention to provide a method of fabricating a waveguide turning mirror using a sacrificial spacer layer.

It is a further object of the present invention to provide a method of fabricating a waveguide turning mirror using a sacrificial spacer layer, wherein a single sacrificial spacer layer operates to create an air gap and to adhere the waveguide to the semiconductor device.

It is another object of the present invention to provide a method of fabricating a waveguide turning mirror using a sacrificial spacer layer, wherein a single sacrificial spacer layer operates to create an air gap and to adhere the waveguide to the semiconductor device and wherein a wet etch is used to remove the sacrificial spacer layer.

The present invention is a method of fabricating a waveguide turning mirror using a sacrificial spacer layer. The first step of the method is selecting a base structure.

The second step of the method is depositing an undercladding layer on the base structure.

The third step of the method is depositing a first cladding layer on the undercladding layer.

The fourth step of the method is depositing a core layer on the first cladding layer.

The fifth step of the method is depositing a second cladding layer on the core layer.

The sixth step of the method is depositing a cap layer on the second cladding layer.

The seventh step of the method is depositing an upper contact on the cap layer. At this point the base optical semiconductor structure is completed.

The eighth step of the method is etching a trench in the resultant structure, wherein the trench penetrates the upper contact, cap layer, second cladding layer, core layer, first cladding layer, and a user-definable portion of the undercladding and the trench is of a user-definable width, and wherein the resultant structure is etched such that it is substantially L-shaped and includes angling the vertex of the trench.

The ninth step of the method is depositing a sacrificial spacer layer along the trench.

The tenth step of the method is fabricating a waveguide on the sacrificial spacer layer.

The eleventh step of the method is removing the sacrificial spacer layer from the upper contact and a user-definable portion of the trench to produce a waveguide turning mirror.

DETAILED DESCRIPTION OF THE PREFERRED EMBODIMENT

Figure 1:
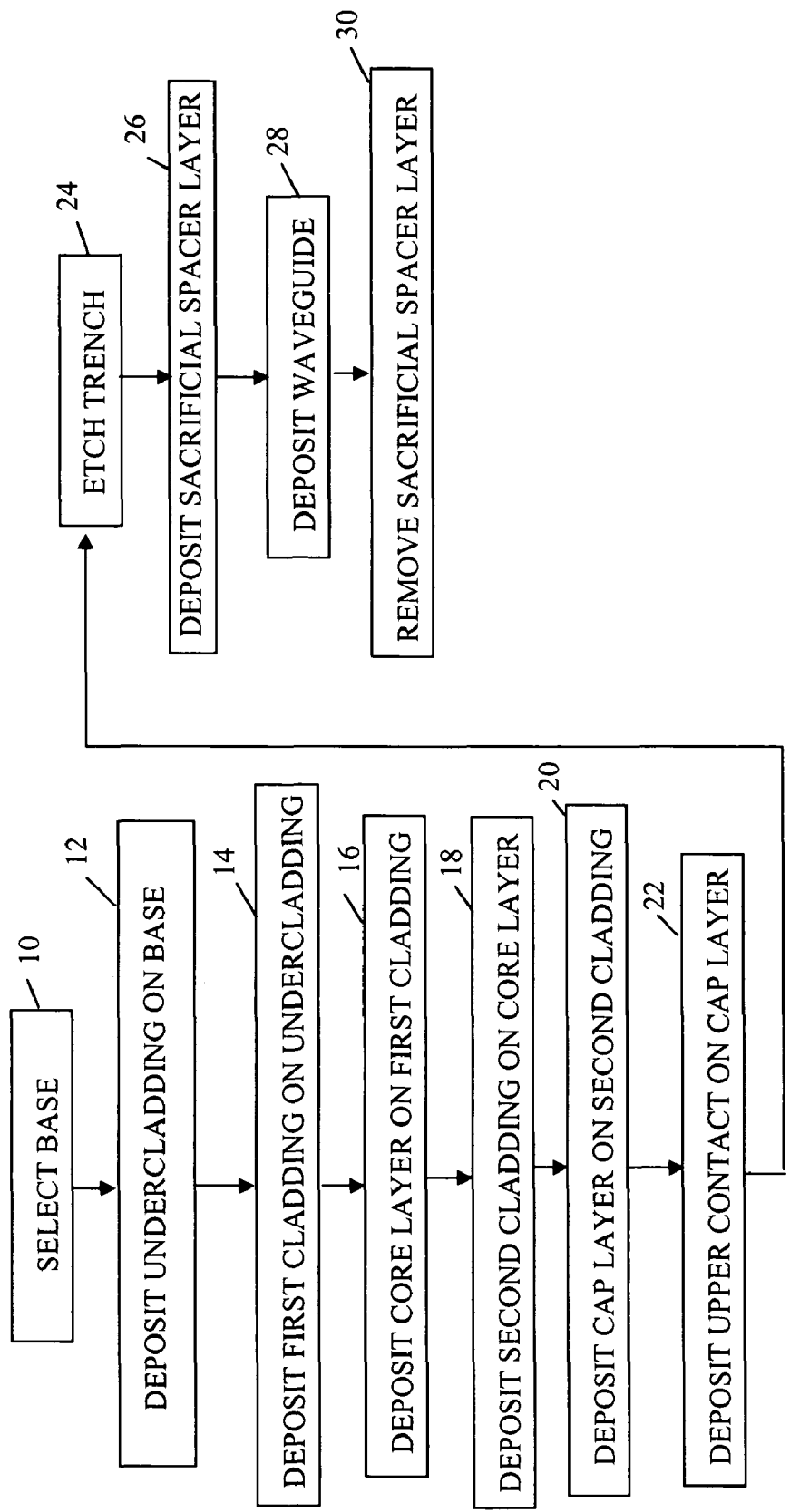
FIG. 1 is a flow chart of the steps of the present invention.

The present invention is a method of fabricating a waveguide turning mirror using a sacrificial spacer layer. FIG. 1 shows the steps of an exemplary embodiment of the method of the present invention. The present invention can operate using any coherent photonic emitter structure, however it will be described with respect to a specific epitaxial structure. It will be understood by those of skill in the art that the method may operate with any suitable coherent photonic emitter structure, such as a standard bipolar, p-i-n semiconductor laser.

The first step 10 of the method of FIG. 1 is selecting a base structure. The base structure, for example a substrate, is composed of a compound semiconductor material and forms the base of the optical device fabricated according to the method of the present invention. In the preferred embodiment, the base structure is an n-type substrate, however the base structure may also be a p-type or undoped substrate according to user preferences. Many such base structures are commercially available, or can be readily produced. The base structure may be of any size, but preferably is approximately 3 inches in diameter.

The second step 12 of the method is depositing an undercladding layer on the base structure. This undercladding improves the electrical efficiency of the semiconductor laser structure. The undercladding layer can be deposited by any conventional method, such as epitaxial growth, chemical vapor deposition, or high-pressure thermal oxidation. The under-cladding layer is composed of a conventional compound semiconductor material. In the preferred embodiment the under-cladding layer is composed of a III-V semiconductor material, such as GaAs.

The third step 14 of the method is depositing a first cladding layer on the undercladding layer. As is well known to those in the art, a cladding layer is used in optical semiconductors to increase optical confinement in the active regions of the optical device. The first cladding layer is a compound semiconductor material, many of which are commercially available or easily producible. In the preferred embodiment the first cladding layer is composed of AlGaAs. The first cladding layer may be deposited through any conventional means, such as epitaxial growth, chemical vapor deposition, or physical vapor deposition.

The fourth step 16 of the method is depositing at least one core layer on the first cladding layer. The core layer operates as the active layer for the semiconductor laser. This core layer is composed of an appropriate compound semiconductor material that will be determined based on the material of the first cladding layer and the required optical properties of the completed optical device. If more than one core layer is required, a barrier layer with an electrical bandgap that is larger than the bandgap of the core layers is used to separate the core layers. In the preferred embodiment two core layers composed of InGaAs are separated by a barrier layer composed of AlGaAs. The core layer may be deposited on the first cladding layer by any conventional means, such as epitaxial growth, chemical vapor deposition, or physical vapor deposition.

The fifth step 18 of the method is depositing a second cladding layer on the core layer. As was explained with reference to the third step 14 of the method, a cladding layer increases optical confinement in the active regions of the optical device. The second cladding layer is preferably composed of the same compound semiconductor material as the first cladding layer, although the second cladding material may be composed of any suitable compound semiconductor material many of which are commercially available or easily producible. In the preferred embodiment the second cladding layer is composed of AlGaAs. The second cladding layer may be deposited through any conventional means, such as epitaxial growth, chemical vapor deposition, or physical vapor deposition, however in the preferred embodiment the second cladding layer is deposited on the core layer in the same manner that the first cladding layer is deposited on the undercladding.

The sixth step 20 of the method of is depositing a cap layer on the second cladding layer. The cap layer is integral to providing for electrical contact to the semiconductor laser, as is obvious to those skilled in the art. The cap layer is composed of a suitable compound semiconductor material compatible with the material of the second cladding layer. In the preferred embodiment the cap layer is composed of GaAs. The cap layer can be deposited by any conventional means, such as epitaxial growth, chemical vapor deposition, or high-pressure thermal oxidation.

The seventh step 22 of the method is depositing an upper electrical contact on the cap layer. The upper contact is typically composed of an Ohmic metal and is composed of a material or materials that provide the correct electronic work function required to establish a low resistance contact to the semiconductor material of the cap layer. In the preferred embodiment the upper contact is a p-type Ohmic metal for p-doped GaAs semiconductor material. In a further preferred embodiment the upper contact is composed of TiPtAu. The upper contact can be deposited by any conventional means, such as electron beam evaporation, thermal evaporation or sputtering.

As is obvious to those of skill in the art, each of the deposition steps above may include additional processing steps, such as polishing, etching, or grinding, to further refine the surfaces of each layer. Every such step is anticipated by this invention and may be used as desired by those skilled in the art. It is further anticipated that any necessary surface preparations for addition of a subsequent layer may be performed, as desired, before a subsequent layer is applied. Additionally, processing may be performed on the cap layer to planarize or otherwise process the surface before further proceeding with the method according to user preferences.

The eighth step 24 of the method is etching a trench in the resultant structure, wherein the trench penetrates the upper contact, cap layer, second cladding layer, core layer, first cladding layer, and a user-definable portion of the undercladding and the trench is of a user-definable width, and wherein the resultant structure is etched such that it is substantially L-shaped and includes angling the vertex of the trench. The resulting shape of the upper contact, cap layer, second cladding layer, core layer, first cladding layer and undercladding after etching is substantially L-shaped having two rectangular protrusions therefrom extending a user-definable length from the vertex of the L-shape. Further, a trench is etched within the stacked structure described. The trench has a substantially U-shaped cross-section and is created in an optical semiconductor for a number of purposes. The trench is necessary for proper performance of the laser, as the trench must first be created prior to creation of some components of the laser. Additionally, in some optical semiconductors the trench can be used to house additional components, such as waveguides. As is obvious to those of skill in the art, etching of the trench may also result in etching of the facets across the core layer, resulting in the creation of mirrors on each side of the resulting trench. The trench can be etched in the structure by any conventional method, but in the preferred embodiment a chlorine based plasma etch is used. In a further preferred embodiment the structure is etched using $BCl_3/Cl_2$. In the preferred embodiment, etching is performed to at least the first cladding layer. The goal is to etch through the core layer(s) to a depth that provides maximum transmission of the optical signal generated by the semiconductor optic device. In a further preferred embodiment, the undercladding is etched to a depth of no greater than 0.5 um past the first cladding layer. Depth into "undercladding" is therefore arbitrary, but a good practice would probably be to etch no more than 0.5 um past the lowest AlGaAs layer. The width of the trench is user definable, but in the preferred embodiment the narrow section of the trench is approximately 8 um.

The ninth step 26 of the method is depositing a sacrificial spacer layer along the horizontal and vertical trench surfaces and a user-definable portion of the remaining upper contact. The sacrificial spacer layer is preferably composed of an oxide material. In a further embodiment the sacrificial spacer layer is composed of $SiO_2$. The sacrificial spacer layer is of a user definable thickness, but in a preferred embodiment is approximately 236.25 nm on the vertical surfaces. The sacrificial spacer layer can be deposited on the structure by any conventional means, but is preferably deposited using a conformal process.

The tenth step 28 of the method is fabricating a waveguide on the sacrificial spacer layer. In the preferred embodiment, the waveguide material fills the remaining portion of the trench, however the waveguide may fill less than the entire trench according to user preferences. Any suitable material can be used for the waveguide, however in the preferred embodiment a polymer material is used, such as benzocyclobutene (BCB.) Any suitable method can be used to deposit the waveguide on the sacrificial spacer layer, such as spin coating the waveguide material on the sacrificial spacer layer. Excess waveguide material may exist after deposition of the waveguide, such as material that has been deposited on the upper contact or that rises above the level of the trench. In a preferred embodiment, if any excess material exists after deposition of the waveguide, it is removed through a plasma etch process such as reactive ion etching (RIE.) This RIE may be performed using appropriate plasmas, such as a fluorine based plasma. The removal of the excess guide material exposes the sacrificial spacer layer material near the regions where gaps are required. This then allows a wet chemical access to the sacrificial spacer layer material so that the sacrificial spacer layer can be selectively removed.

The eleventh step 30 of the method is removing the sacrificial spacer layer from the upper contact and a user-definable portion of the trench. In the eleventh step 30 a user-definable portion of the sacrificial spacer layer is removed to create gaps between the waveguide and the portions of the undercladding, first cladding layer, core layer, second cladding layer, cap layer, and upper contact that were exposed on each side of the trench. The sacrificial spacer layer may additionally be removed from a user-definable portion of the base of the trench, however a sufficient amount of the sacrificial spacer layer must remain to adhere the waveguide to the base of the trench. The sacrificial spacer layer can be removed by any conventional means, however in the preferred embodiment it is removed by a timed wet etch. The timed etch is preferably performed with buffered hydrofluoric acid. The removal of the sacrificial spacer layer material at the vertex of the L-shape of the waveguide produces a mirror at the vertex. Specifically, as the photons pass through one leg of the L-shaped waveguide they will impact the mirror at a given angle of incidence. The photons will then reflect off at an equivalent angle of reflectance down the opposing leg of the L-shaped waveguide through well-known principles of physics.

The result of the above described process is an approximately L-shaped optical semiconductor device consisting of a laser with an integral waveguide with side air gaps and a bend mirror in the waveguide. The air gaps exist between the waveguide and the sidewalls of the trench formed by the etching process. This process is less time consuming and more cost efficient than previous methods for creating air gaps in optical semiconductor devices as a single step is required for the creation of the sacrificial spacer layer and the adhesion layer for the waveguide. Removal of the sacrificial spacer layer also occurs in a single step. Because simple processes are used to achieve each step, the method of the present invention creates significant advantages over the prior art inventions.

Figure 2:
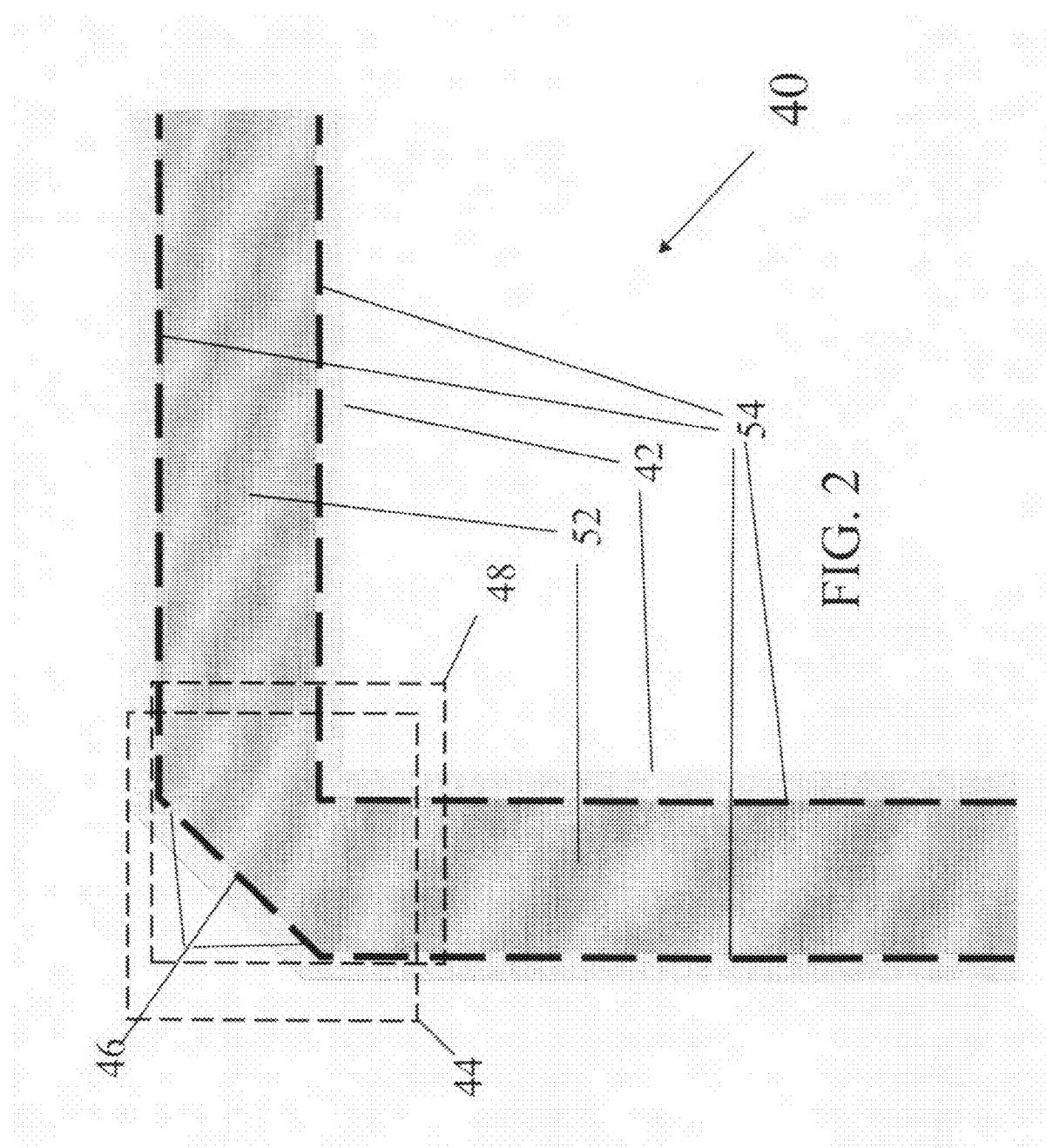
FIG. 2 is a top plan view of a device manufactured in accordance with the present invention.

A product 40 developed by this process is shown in FIG. 2. As can be seen, two straight sections 42 are present in the waveguide, as is one angled section 44 having a mirror 46 gap therein. The sidewalls, undercladding, first cladding layer, core layer, second cladding layer, and cap layer similarly form an L-shaped section 48 as described. As can further be seen trenches 52 exist along the undercladding. This structure includes precisely spaced gaps 54 between components through the method described in the present invention to create an integrated waveguide turning mirror and reduce losses in the waveguide.

Figure 3:
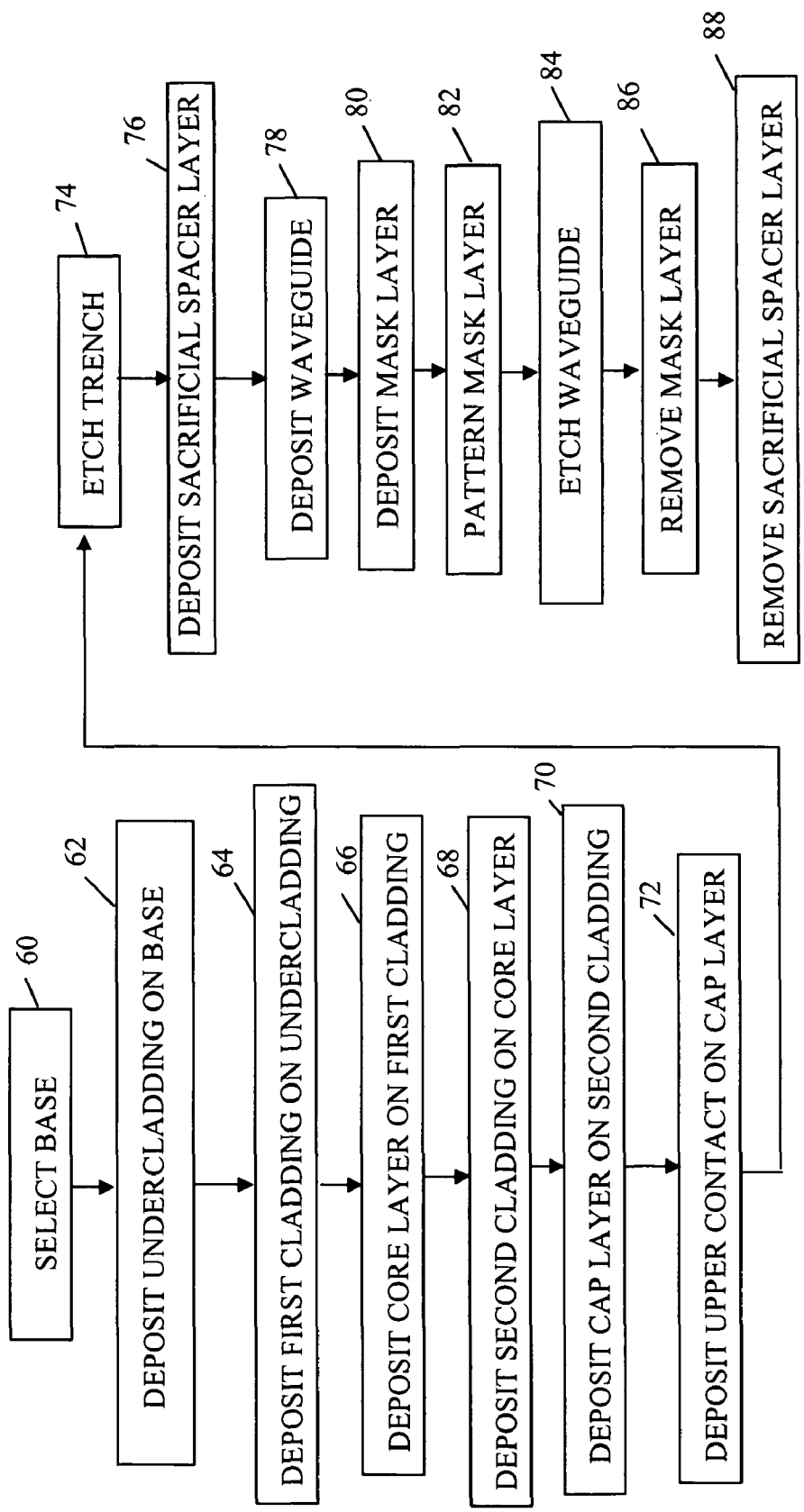
FIG. 3 is a flow chart of the steps of an alternative embodiment of the present invention.

The steps of a method of an alternative embodiment are shown in FIG. 3. The first step 60 of the alternative method of FIG. 3 is selecting a base structure. This step is essentially identical to the first step 10 of the method if FIG. 1, and therefore will not be discussed in detail. As with the first step 10 of FIG. 1, the base structure in the preferred embodiment is a compound semiconductor.

The second step 62 of the alternative method of FIG. 3 is depositing an undercladding layer on the base structure. As with the second step 12 of the method of FIG. 1, this undercladding improves the electrical efficiency of the semiconductor laser structure. The undercladding layer can be deposited by any conventional method, such as epitaxial growth, chemical vapor deposition, or high-pressure thermal oxidation. The under-cladding layer is composed of a conventional compound semiconductor material. In the preferred embodiment the under-cladding layer is composed of a III-V semiconductor material, such as GaAs.

The third step 64 of the alternative method of FIG. 3 is depositing a first cladding layer on the undercladding layer. As is well known to those in the art, a cladding layer is used in optical semiconductors to increase optical confinement in the active regions of the optical device. The first cladding layer is a compound semiconductor material, many of which are commercially available or easily producible. In the preferred embodiment the first cladding layer is composed of AlGaAs. The first cladding layer may be deposited through any conventional means, such as epitaxial growth, chemical vapor deposition, or physical vapor deposition.

The fourth step 66 of the alternative method is depositing at least one core layer on the first cladding layer. The core layer operates as the active layer for the semiconductor laser. This core layer is composed of an appropriate compound semiconductor material that will be determined based on the material of the first cladding layer and the required optical properties of the completed optical device. If more than one core layer is required, a barrier layer with an electrical bandgap that is larger than the bandgap of the core layers is used to separate the core layers. In the preferred embodiment two core layers composed of InGaAs are separated by a barrier layer composed of AlGaAs. The core layer may be deposited on the first cladding layer by any conventional means, such as epitaxial growth, chemical vapor deposition, or physical vapor deposition.

The fifth step 68 of the alternative method is depositing a second cladding layer on the core layer. As was explained with reference to the third step 64 of the alternative method, a cladding layer increases optical confinement in the active regions of the optical device. The fifth step 68 of the alternative method is essentially identical to the fifth step 18 of the method of FIG. 1, and therefore will not be discussed in further detail.

The sixth step 70 of the alternative method of FIG. 3 is depositing a cap layer on the second cladding layer. The cap layer is integral to providing for electrical contact to the semiconductor laser, as is obvious to those skilled in the art. The cap layer is composed of a suitable compound semiconductor material compatible with the material of the second cladding layer. In the preferred embodiment the cap layer is composed of GaAs. The cap layer can be deposited by any conventional means, such as epitaxial growth, chemical vapor deposition, or high-pressure thermal oxidation.

The seventh step 72 of the alternative method is depositing an upper electrical contact on the cap layer. The upper contact is typically composed of an Ohmic metal and is composed of a material or materials that provide the correct electronic work function required to establish a low resistance contact to the semiconductor material of the cap layer. In the preferred embodiment the upper contact is a p-type Ohmic metal for p-doped GaAs semiconductor material. In a further preferred embodiment the upper contact is composed of TiPtAu. The upper contact can be deposited by any conventional means, such as electron beam evaporation, thermal evaporation or sputtering.

As with the method of FIG. 1, each of the deposition steps above may include additional processing steps, such as polishing, etching, or grinding, to further refine the surfaces of each layer. Every such step is anticipated by this invention and may be used as desired by those skilled in the art. As was further discussed above in reference to the method of FIG. 1, it is anticipated in the alternative method that any necessary surface preparations for addition of a subsequent layer may be performed, as desired, before a subsequent layer is applied. Additionally, processing may be performed on the cap layer to planarize or otherwise process the surface before further proceeding with the method according to user preferences.

The eighth step 74 of the alternative method is etching a trench in the resultant structure, wherein the trench penetrates the upper contact, cap layer, second cladding layer, core layer, first cladding layer, and a user-definable portion of the undercladding and the trench is of a user-definable width. A trench has a substantially U-shaped cross-section and is created in an optical semiconductor for a number of purposes. In the alternative embodiment, the etched trench is substantially L-shaped and includes a section of user-definable wider width extending from the vertex of the L-shaped trench a user-definable length along each leg of the L-shaped trench. The resulting shape is a substantially L-shaped trench having two rectangular protrusions therefrom extending a user-definable length from the vertex of the L-shape. The resulting structure will have a uniform width at all sections not associated with a section of the trench having a user-definable wider width. In the remaining sections the trench will have a width of the user-definable width discussed with reference to the second step 62. The trench is not only necessary for proper performance of the laser, but in some optical semiconductors the trench can be used to house additional components, such as waveguides. As is obvious to those of skill in the art, etching of the trench may also result in etching of the facets across the core layer, resulting in the creation of mirrors on each side of the resulting trench. The trench can be etched in the structure by any conventional method, but in the preferred embodiment a chlorine-based plasma etch is used. In a further preferred embodiment the structure is etched using $BCl_3/Cl_2$. In the preferred embodiment, etching is performed to at least the first cladding layer. The goal is to etch through the core layers to a depth that provides maximum transmission of the optical signal generated by the semiconductor optical device. In a further preferred embodiment, the undercladding is etched to a depth of no greater than 0.5 um past the first cladding layer. Depth into "undercladding" is therefore arbitrary, but a good practice would probably be to etch no more than 0.5 um past the lowest AlGaAs layer. The width of the trench is user definable, but in the preferred embodiment the narrow section of the trench is approximately 8 um.

The ninth step 76 of the alternative method is depositing a sacrificial spacer layer along the horizontal and vertical trench surfaces and a user-definable portion of the remaining upper contact. The sacrificial spacer layer is preferably composed of an oxide material. In a further embodiment the sacrificial spacer layer is composed of $SiO_2$. The sacrificial spacer layer is of a user definable thickness, but in a preferred embodiment is approximately 236.25 nm on the vertical surfaces. The sacrificial spacer layer can be deposited on the structure by any conventional means, but is preferably deposited using a conformal process.

The tenth step 78 of the alternative method is fabricating a waveguide on the sacrificial spacer layer. In the preferred embodiment, the waveguide material fills the remaining portion of the trench, however the waveguide may fill less than the entire trench according to user preferences. Any suitable material can be used for the waveguide, however in the preferred embodiment a polymer material is used, such as benzocyclobutene (BCB.) The tenth step 78 is essentially identical to the tenth step 28 of the method of FIG. 1, and therefore will not be discussed in further detail.

The eleventh step 80 of the alternative method is depositing a mask layer. In the preferred embodiment a photoresist is used as the mask layer to define the waveguide described in the tenth step 78.

The twelfth step 82 of the alternative method is to pattern the mask layer on the portion of the waveguide deposited within the region associated with the trench having a user-definable wider width as defined in the eight step 74 of the alternative method, wherein the mask layer defines a substantially L-shaped waveguide region having a user definable width along each leg of the waveguide at the regions of the trench that is not of a user-definable wider width. A mask layer defines areas of semiconductor and optical devices, such as the waveguide, to allow a specific or precise design of a device to be achieved. Many types of masks and masking processes are known in the art, and any such mask may be used in conjunction with the present invention.

The thirteenth step 84 of the alternative method is patterning the waveguide beneath the mask layer. The method of patterning the waveguide will be dependant on the material used for the mask layer and the material used to form the waveguide. In a preferred embodiment, a plasma etch is used to pattern the waveguide including angling the vertex of the L-shape of the waveguide, wherein the angling is performed by means of etching to produce a mirror. Removal of the corner of the L-shaped waveguide produces a mirror on the waveguide corner. Specifically as the photons pass through one leg of the L-shaped waveguide they will impact the mirror at a given angle of incidence. The photons will then reflect off at an equivalent angle of reflectance down the opposing leg of the L-shaped waveguide through well-known principles of physics. In a preferred embodiment a reactive ion etch (RIE) process is used to pattern the waveguide. In a further preferred embodiment, if any excess material exists after deposition of the waveguide, it is removed through a RIE plasma etch process at the same time as the L-shaped waveguide is defined. This RIE may be performed using appropriate plasmas, such as a fluorine based plasma. The removal of the excess guide material exposes the sacrificial spacer layer material near the regions where gaps are required. This then allows a wet chemical access to the sacrificial spacer layer material so that the sacrificial spacer layer can be selectively removed.

The fourteenth step 86 of the alternative method is removing the mask layer. The removal of the mask layer exposes the underlying waveguide. The resulting waveguide should be substantially L-shaped, as was explained in greater detail above. The mask layer is removed by any process appropriate to the material that composes the mask layer. In a preferred embodiment the mask layer is composed of a photoresist, therefore the mask layer is preferably removed by a dry etch, wet chemical etch or other process appropriate to photoresist removal.

The fifteenth step 88 of the alternative method is removing the sacrificial spacer layer from the upper contact and a user-definable portion of the trench. In the fifteenth step 88 a user-definable portion of the sacrificial spacer layer is removed to create gaps between the waveguide and the portions of the undercladding, first cladding layer, core layer, second cladding layer, cap layer, and upper contact that were exposed on each side of the trench. The sacrificial spacer layer may additionally be removed from a user-definable portion of the base of the trench, however a sufficient amount of the sacrificial spacer layer must remain to adhere the waveguide to the base of the trench. The sacrificial spacer layer can be removed by any conventional means, however in the preferred embodiment it is removed by a timed wet etch. The timed etched is preferably performed with buffered hydrofluoric acid.

The result of the process described above is an approximately L-shaped optical semiconductor device consisting of a laser with an integral waveguide with side air gaps and an enlarged side trench associated with an etched turning mirror in the waveguide. The air gaps exist between the waveguide and the sidewalls of the trench formed by the etching process. As with the first method, this process is less time consuming and more cost efficient than previous methods for creating air gaps in optical semiconductor devices as a single step is required for the creation of the sacrificial spacer layer and the adhesion layer for the waveguide. Removal of the sacrificial spacer layer also occurs in a single step. Because simple processes are used to achieve each step the method of the alternative embodiment creates significant advantages over the prior art inventions.

Figure 4:
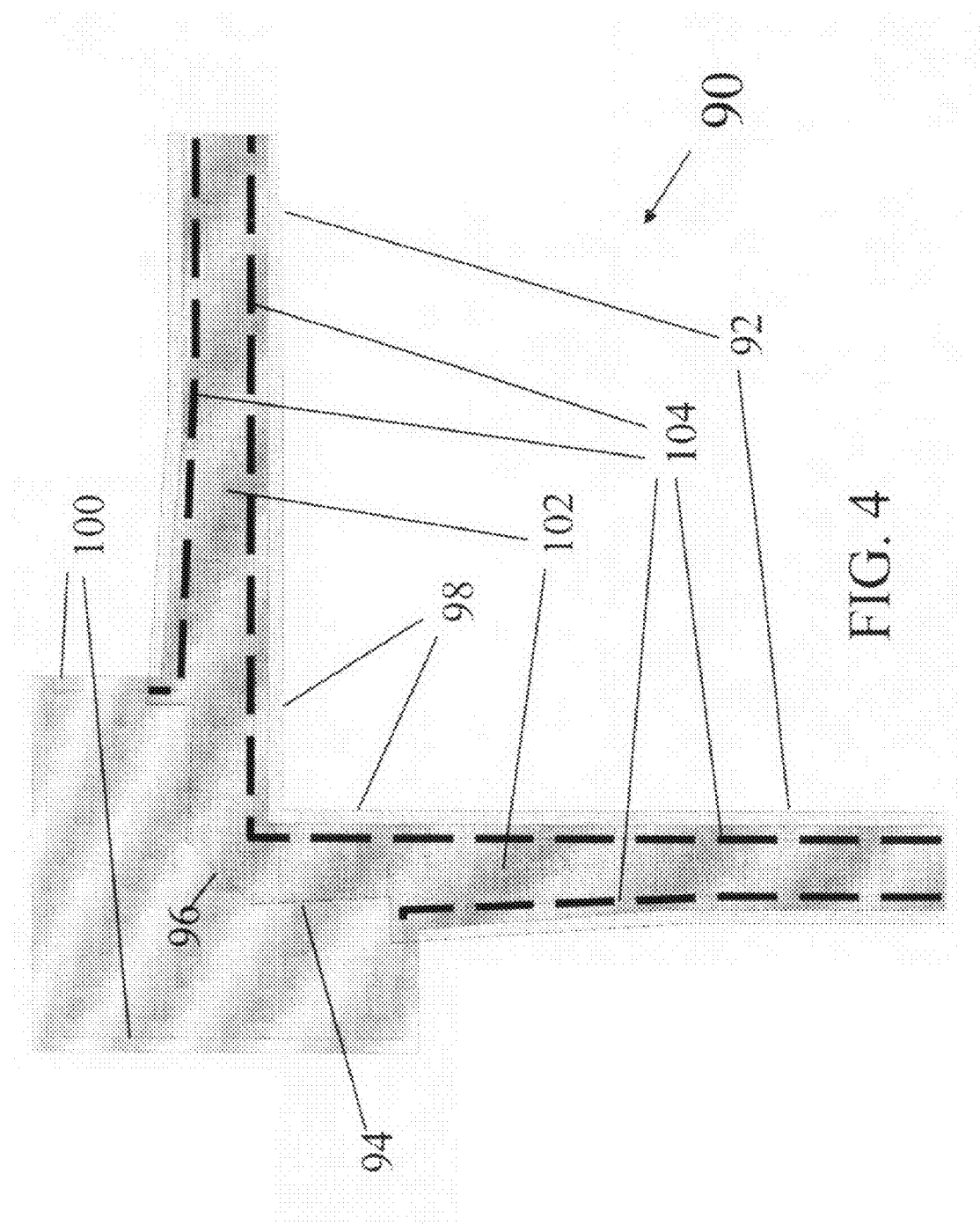
FIG. 4 is a top plan view of a device manufactured in accordance with the alternative embodiment of the present invention

A product 90 developed by this process is shown in FIG. 4. As can be seen, two straight sections 92 are present in the waveguide, as is one angled section 94 having a mirror 96 etched therein. The sidewalls, undercladding, first cladding layer, core layer, second cladding layer, and cap layer similarly form an L-shaped section 98 as described and a section having an increased section of wider width at its vertex 100. As can further be seen trenches 102 exist along the undercladding and in the increased section of wider width. This structure includes precisely spaced gaps 104 between components through the method described in the alternative embodiment to coherently enhance or reduce reflections from the interfaces.

What is claimed is:

1. An optical semiconductor device, comprising:
a) a coherent photonic emitter structure;
b) a trench of a user definable width etched in the coherent photonic emitter structure such that the coherent photonic emitter structure is substantially L-shaped and includes;
c) a sacrificial spacer layer deposited along a user-definable section of the trench;
d) a waveguide fabricated on the sacrificial spacer layer; and
e) a user-definable portion of the sacrificial spacer layer removed.

2. The device of claim 1, wherein the waveguide further comprises:
a) a waveguide material deposited on a user-definable portion of the sacrificial spacer layer; and b) excess waveguide material etched away to form the waveguide.

3. The device of claim 2, wherein the coherent photonic emitter structure comprises a coherent photonic emitter structure, wherein the coherent photonic emitter structure comprises a base structure, a first cladding layer, a core layer, a second cladding layer, a cap layer and an upper contact.

4. The device of claim 1, wherein the coherent photonic emitter structure comprises a coherent photonic emitter structure, wherein the coherent photonic emitter structure comprises a base structure, a first cladding layer, a core layer, a second cladding layer, a cap layer and an upper contact.

* * * * *